Jan. 7, 1964 J. H. KUCK ETAL 3,117,284
NOISE DISCRIMINATION CONTROL CIRCUIT UTILIZING A VOLUME
CONTROL THERMIONIC AMPLIFIER CIRCUIT
Filed Feb. 25, 1944 4 Sheets-Sheet 1

INVENTORS
JOHN H. KUCK
ROBERT H. THAYER
BY
ATTORNEY

INVENTORS
JOHN H. KUCK
ROBERT H. THAYER
BY
[signature]
ATTORNEY

INVENTORS
JOHN H. KUCK
ROBERT H. THAYER
BY
ATTORNEY

INVENTORS
JOHN H. KUCK
ROBERT H. THAYER
BY
ATTORNEY

United States Patent Office 3,117,284
Patented Jan. 7, 1964

3,117,284
NOISE DISCRIMINATION CONTROL CIRCUIT UTILIZING A VOLUME CONTROL THERMIONIC AMPLIFIER CIRCUIT

John H. Kuck, Silver Spring, Md., and Robert H. Thayer, Washington, D.C., assignors to the United States of America as represented by the Secretary of the Navy Filed Feb. 25, 1944, Ser. No. 523,886
3 Claims. (Cl. 328—165)

This invention relates generally to improvements in thermionic amplifying devices and more particularly to an improved compression circuit especially adapted for use in the amplifier of a radio proximity fuze.

Steady noise may arise in such an amplifier from vibrations of tube elements which may be set up as a result of harmonic forces arising from the combined spin and yaw of the projectile when in flight. The "wave effect" (movement of the projectile close to ocean waves) may likewise produce an undesirable noise signal. It is therefore the primary object of this invention to provide an improved amplifier which will discriminate against continuous noise, so that it will not give sufficient output from a steady noise input to fire a grid-controlled or "trigger-acting" arc tube of the thyratron type but will respond to a signal of short duration, such as a "ripple" signal, for triggering such a tube.

Another object of the invention is to provide an amplifier wherein the noise discrimination is accomplished by applying a rectified portion of the output voltage, through a time delay circuit, to the grid of the first amplifier tube as negative bias.

A further object of the invention is to provide an amplifier compression circuit wherein the compression takes effect in a time shorter than the normal arming time of the fuze, with the result that noise existing at the beginning of the flight of the projectile will be suppressed and the arming condenser will be allowed to charge, thus assuring a live fuze after the passage of a predetermined time.

Still another object is to provide an amplifier which is so arranged that the gain is automatically regulated, according to the existing noise level, and the probability of premature fuze operation due to random noise thereby reduced.

Further objects of the invention, not mentioned herein above, will become evident during the course of the following description, taken in conjunction with the accompanying drawings, throughout the several views of which like reference characters designate similar parts.

Figure 1:
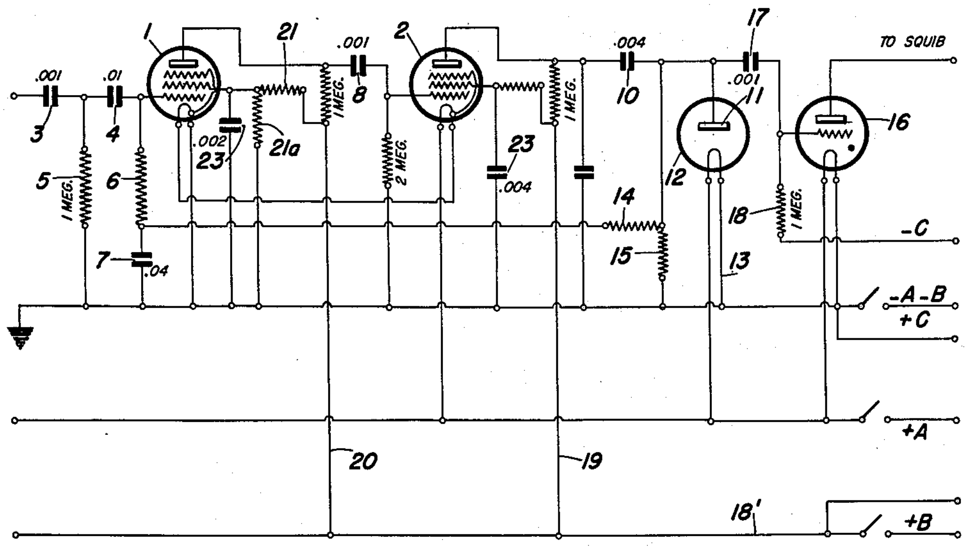
FIG. 1 is a schematic view of the improved amplifier.

FIGS. 3 to 7 inclusive are curves showing performance of the circuit.

Referring now to the drawings, reference numerals 1 and 2 designate amplifying tubes of the pentode type. In this connection it should be understood that tubes of other types may be used, if preferred. The amplifying tube 1 includes an input circuit comprising two condensers 3, 4 and a resistor 5. A grid to ground resistor is shown at 6. The components which constitute the time delay and filter circuit include a condenser 7 which is connected between the resistor 6 and the ground. As will be understood, the term "ground" here means the shell, or body, of the projectile.

The second amplifying tube 2 is coupled to the output of the coupling condenser 8, and the output of this tube is connected, through a coupling condenser 10, to the anode 11 of a diode 12. The filament, or cathode, of the diode 12 is connected to ground by a suitable conductor 13 which ground terminal also constitutes a negative terminal for the filament battery. As stated, the ground terminal is constituted by the body of the shell or projectile.

The anode 11 of the diode 12 is also connected to the meeting terminals of resistors 14 and 15. The resistor 14 cooperates with the condenser 7 to provide a time delay and to filter the current rectified by the diode, as will be described in detail hereinafter. The resistor 15 will function to permit a leaking off of the charge of the condenser 7 when there is a decrease in the rectified voltage from the diode. Therefore, a decrease in the amount of compression will follow a decrease in the amplitude of the noise signal.

The output of the amplifying tube 2 is also connected to the grid of a gas-containing thermionic tube, such as a thyratron 16 through a coupling condenser 17, the grid of the thyratron being biased through a resistor 18 and the plate of said tube being connected in the circuit with the squib (not shown) or other firing means, and the plate battery. The plate, or B, battery is connected to the plates of the amplifying tubes through conductors 18', 19 and 20, the conductor 20 being connected to the plate load resistor and to one terminal of a screen voltage divider 21—21*a*, said divider including resistors 21 and 21*a*. The divider is so arranged that proper voltage will be applied to the screen of the amplifying tube 1. Suitable by-pass condensers 23 are connected between the screens of the tubes 1 and 2 and the ground.

The operation of the invention will now be briefly described. A signal entering the input circuit of the first amplifying tube, 1, from the oscillator (not shown) will be impressed upon the control grid of said tube. The said signal will be amplified by tube 1 and in turn will become the input signal for the succeeding tube. This signal will be amplified by the second amplifying tube, 2, and practically the full amplitude of the amplified signal will be fed into the grid of tube 16, through the condensers 10 and 17. However, this condition will exist only momentarily, since a portion of this signal voltage is rectified by the diode 12, and this rectified voltage is applied to the grid of the first tube, through the delay circuit, as negative bias. Due to the fact that this delay circuit is employed, compression will not take place until after the desired time interval has passed. This time interval will be of sufficient duration to permit a ripple, or pulse, signal to build up to sufficient amplitude to trigger the thyraton, but will be short enough so that compression (discrimination against continuous noise) will take effect before the firing circuit becomes armed. In this connection, it is desired to point out that the condenser 7 and the resistor 14 serve not only to provide a time delay but also to filter the rectified voltage.

The divider 21—21*a*, as will be seen, provides suitable screen voltage for the first amplifying tube 1, so that said tube 1 will have sharp cut-off characteristics.

It should be understood that, although the values of resistors and condensers have been indicated on the drawings, resistors and condensers of other values may be used if it is desired to vary the response of the circuit.

It should also be understood that compression will take effect in a time shorter than the normal arming time. Therefore, there is no possibility that the firing condenser will arm (charge to the value necessary to fire the squib) before the compression has had a chance to reduce the gain of the amplifier sufficiently to render a noise pulse of even unusually great amplitude less likely to fire the thyratron.

Figures 3, 5:
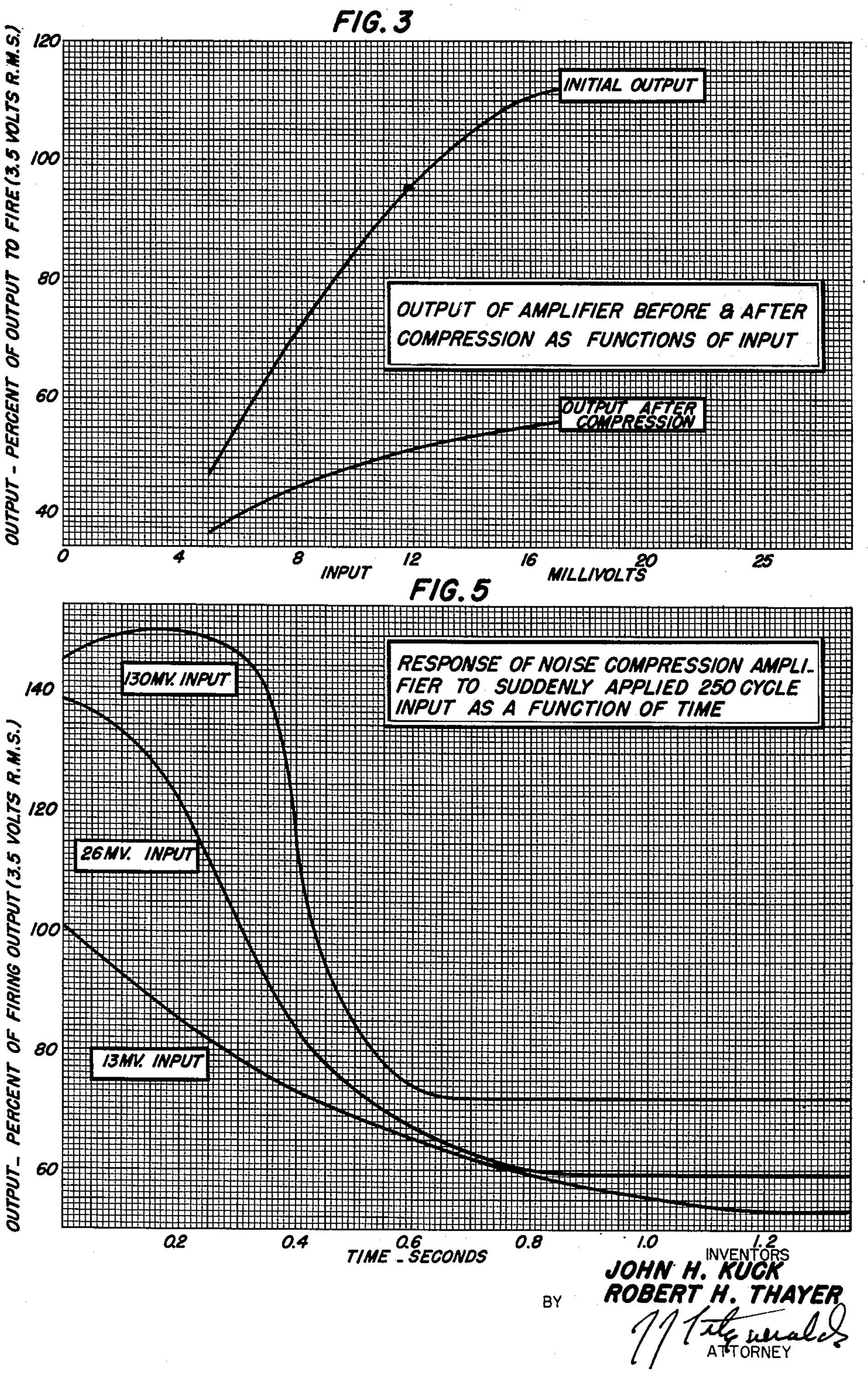

The curves shown in FIGS. 3–7 show the performance of the improved circuit. More particularly, FIG. 3 shows both the initial output from suddenly applied signals and the output after compression takes effect. For example, an input of 13 millivolts, which initially was sufficient to produce firing, produced only 52% of firing output after compression.

Figure 4:
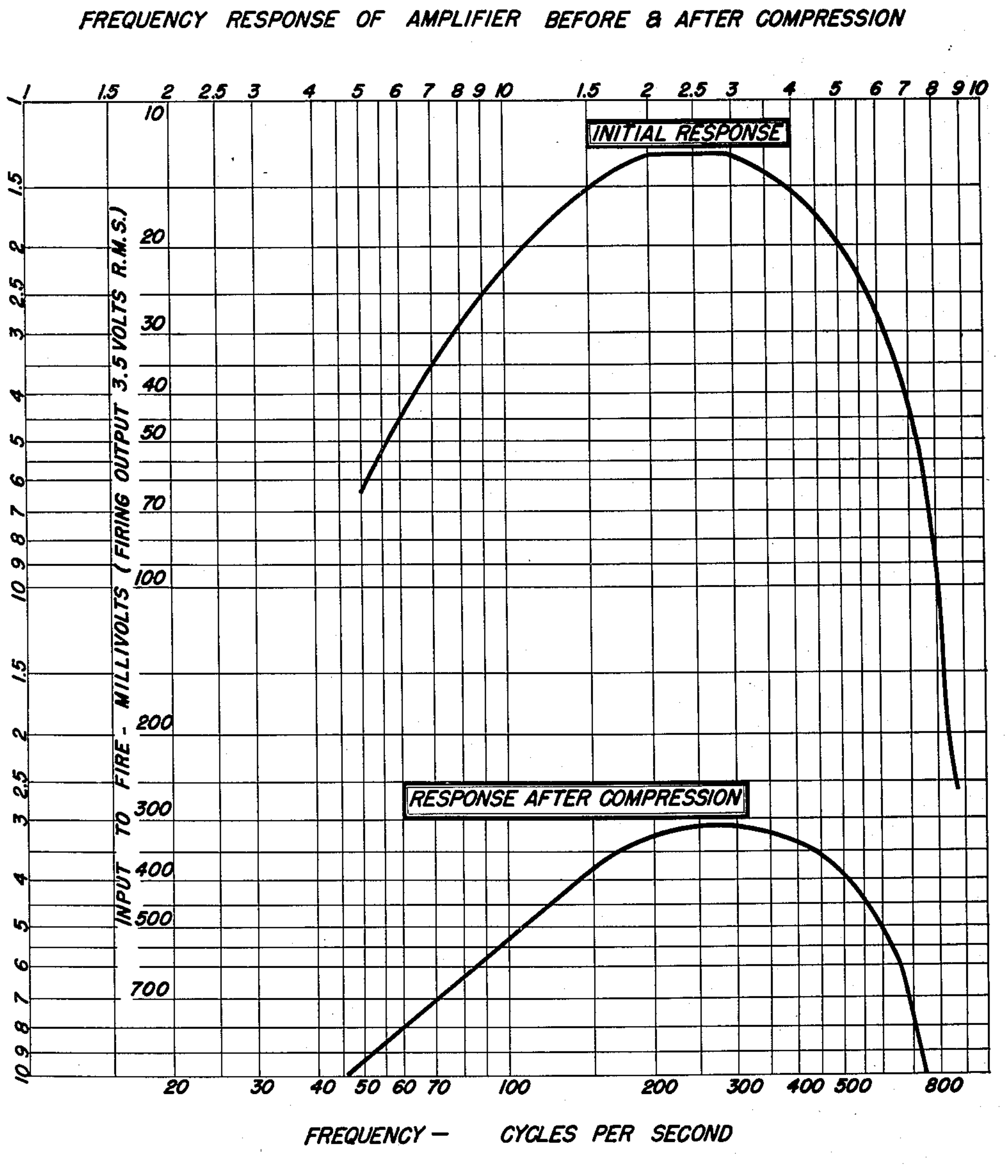

In FIG. 4, the frequency response, in terms of millivolts input necessary to fire the tube 16, is shown. One curve is the initial response to a suddenly applied input signal and the other curve indicates the steady input signal necessary. Thus, while a 13 millivolt initial signal at 250 cycles will fire the trigger tube, a steady noise of the same frequency would not fire said tube if it were less than 315 millivolts.

Figure 6:
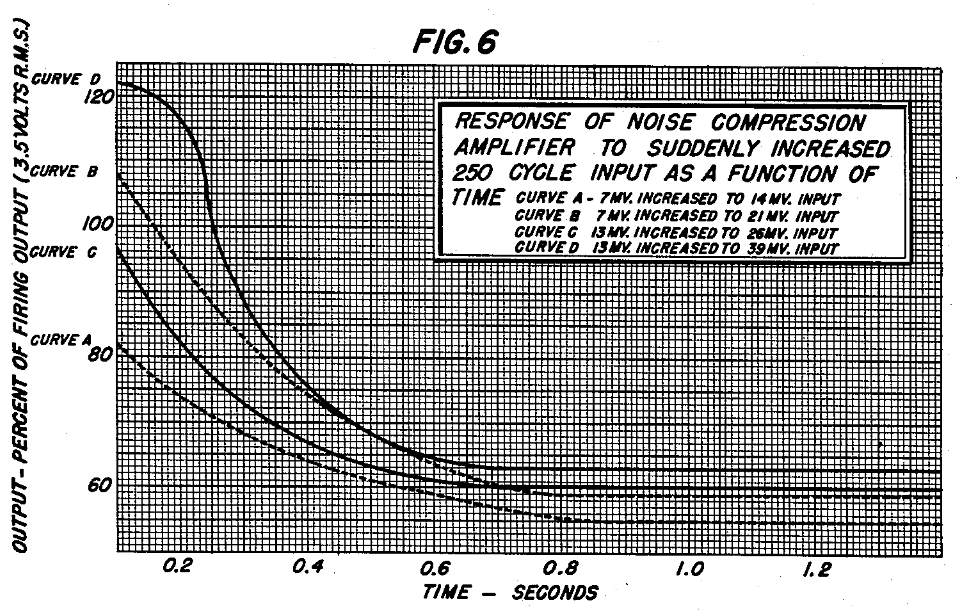
Figure 7:
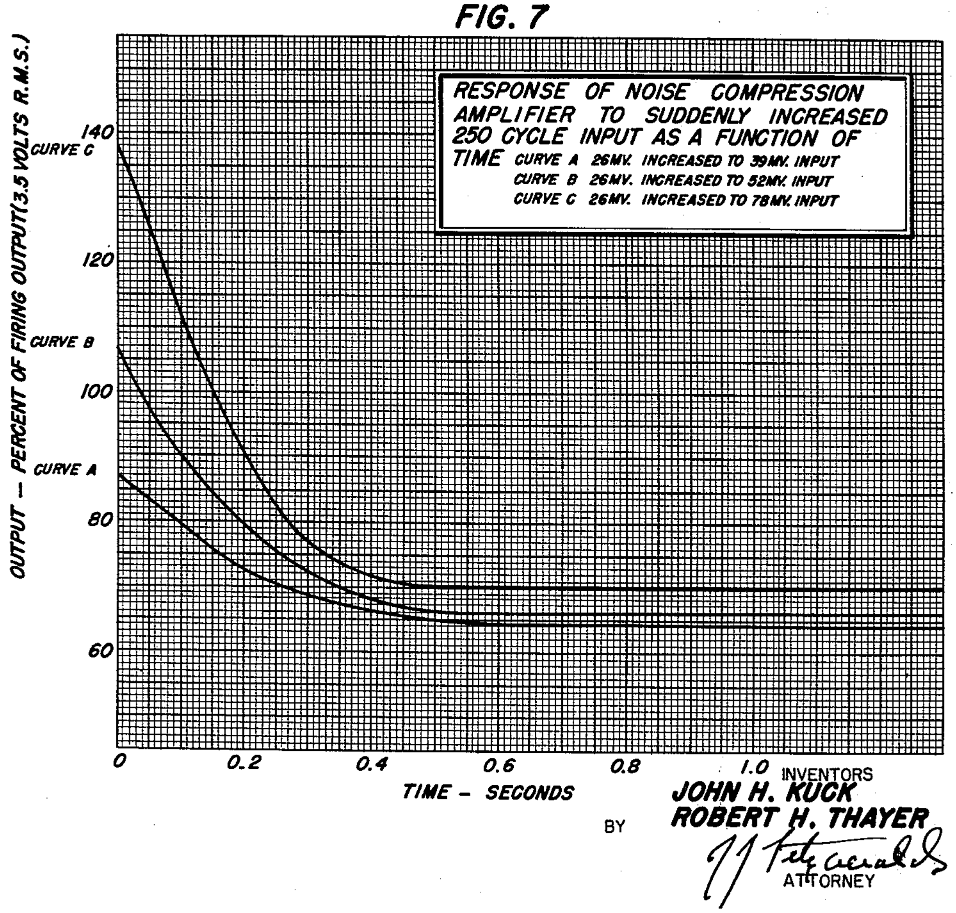

Motion pictures have been taken to show decay of output with time, and the curves in FIGS. 5, 6 and 7 were plotted from these pictures. FIG. 5 shows the response to suddenly applied signals of three different amplitudes. FIGS. 6 and 7 indicate the action taking place when the amplitude of steady signals is suddenly increased. Curve B of FIG. 7 indicates that, even with a steady noise input of 26 millivolts, the system could still be fired with an additional signal of 26 millivolts.

Figure 2:
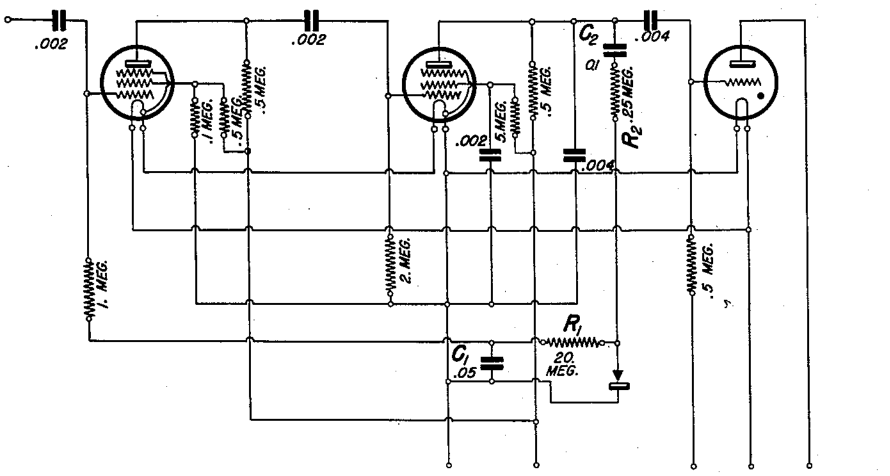
FIG. 2 is a schematic view showing a slightly modified arrangement.

Although the circuit of FIG. 1 shows a diode rectifier, it should be understood that rectifiers of other types may be used. A compression circuit utilizing a copper oxide rectifier is shown in FIG. 2. In this view the resistor R–1 and condenser C–1 serve the dual purpose of providing a time delay before compression takes effect, and of acting as a filter. Rectification of peak A.C. voltage is obtained if the discharge time constant of C–2, through the inverse resistance of the rectifier, is sufficiently long. As will be noted, a resistor corresponding to the resistor 15 is eliminated in FIG. 2 for the reason that the inverse resistance of the rectifier (copper oxide) is such that said resistor is unnecessary. Resistor R–2 is used with this rectifier to increase the plate load impedance. As in the circuit of FIG. 1, dividing resistances are used to provide screen voltage for the amplifier tubes.

As pointed out heretofore, the improved compression circuit will operate to suppress noise existing at the beginning of flight of a projectile. Thus, the arming condenser will be permitted to charge, with the result that repeated firings will be prevented, and a live fuze after five seconds will be assured. As indicated in the curves of FIGS. 5–7, compression takes effect in a time shorter than the normal arming time. Fuze failures, due to the "wave effect," would be prevented for the same reasons. Also, as the gain is automatically regulated according to the existing noise level, the probability of premature detonation due to random noise will be greatly reduced. As was also pointed out in the objects at the beginning of this description, continuing noise, as would be produced by yaw and spin of the shell, could never fire the thyratron, but the fuze would still respond to a ripple signal, even though its sensitivity might be somewhat reduced. Thus, projectiles which might otherwise be ineffective would retain at least a portion of their effectiveness.

What is claimed is:

1. In an amplifier system for actuating a proximity fuze having a thyratron in response to transient type oscillatory target signals of a few cycles duration, a multiple stage low frequency amplifier having an input circuit and an output circuit, means for discriminating against continuous noise and intermittent single pulse noise to prevent undesired firing of said thyratron thereby, said means comprising a rectifier having the cathode thereof connected directly to ground to receive and rectify a portion of the amplifier output signal, a resistance-capacitance circuit directly connected between the output of said amplifier and the anode of said rectifier and a second resistance-capacitance circuit connected between the anode of said rectifier and the input of said thyratron, whereby the rectifier circuit provides an initial clipping action to the positive half of the first cycles of said amplifier output signal which is applied to the grid of said thyratron and causes said clipping action to disappear on subsequent cycles, a biasing circuit connected to said rectifier and to the input circuit of said amplifier to apply said rectified signal portion thereto as a negative grid bias, thereby diminishing the output of the amplifier, including a low pass filter means having a time-constant corresponding to said transient type oscillatory target signals of a few cycles duration, for limiting the rate at which the gain is reduced, whereby said target signals are translated without substantial reduction in gain while slowly increasing long duration signals are substantially reduced by action of said biasing circuit.

2. In an amplifier system for actuating a proximity fuze having a thyratron in response to transient type oscillatory target signals of a few cycles duration, a multiple stage low frequency thermionic audio-frequency amplifier having an input circuit and an output circuit, means for discriminating against continuous noise and intermittent single pulse noise to prevent undesired firing of said thyratron thereby, said means comprising a diode having the cathode thereof connected directly to ground to receive and rectify a portion of the amplifier output signal, a resistance-capacitance circuit directly connected between the output of said amplifier and the anode of said diode and a second resistance-capacitance circuit connected between the anode of said diode and the input of said thyratron, whereby the diode circuit provides an initial clipping action to the positive half of the first cycles of said amplifier output signal which is applied to the grid of said thyratron and causes said clipping action to disappear on subsequent cycles, a biasing circuit connected to the said diode and to the input circuit of said amplifier to apply said rectified signal portion thereto as a negative grid bias, thereby diminishing the output of the amplifier, including a low pass filter means having a time-constant corresponding to said transient type oscillatory target signals of a few cycles duration, for limiting the rate at which the gain is reduced, whereby said target signals are translated without substantial reduction in gain while slowly increasing long duration signals are substantially reduced by action of said biasing circuit.

3. In an amplifier system for actuating a proximity fuze having a thyratron in response to transient type oscillatory target signals of a few cycles duration, a multiple stage exclusively resistance-capacitance-coupled thermionic amplifier having a grid-controlled input circuit and an output circuit, means for discriminating against continuous noise and intermittent single pulse noise to prevent undesired firing of said thyratron thereby, said means comprising a rectifier having the cathode thereof connected directly to ground to receive and rectify a portion of the amplifier output signal, a resistance-capacitance circuit directly connected between the output of said amplifier and the anode of said rectifier and a second resistance-capacitance circuit connected between the anode of said rectifier and the input of said thyratron, whereby the rectifier provides an initial clipping action to the positive half of the first cycles of said amplifier output signal which is applied to the grid of said thyratron and causes said clipping action to disappear on subsequent cycles, a biasing circuit connected to the output of said rectifier and to the input circuit of said amplifier to apply said rectified signal portion thereto as a negative grid bias, thereby diminishing the output of the amplifier, including a low pass filter means having a time-constant corresponding to said transient type oscillatory target signals of a few cycles duration, for limiting the rate at which the gain is reduced, whereby said target signals are translated without substantial reduction in gain while slowly increasing long duration signals are substantially reduced by action of said biasing circuit, and a high resistance bleeder resistor connected across said biasing circuit to dissipate said bias and thus restore the sensitivity of said input circuit after cessation of noise.

References Cited in the file of this patent

UNITED STATES PATENTS

| | | |
|---|---|---|
| 2,052,613 | Farnham | Sept. 1, 1936 |
| 2,171,679 | Wohlfarth et al. | Sept. 5, 1939 |
| 2,196,259 | Foster | Apr. 9, 1940 |
| 2,265,868 | Schonland | Dec. 9, 1941 |
| 2,273,098 | Foster | Feb. 17, 1942 |
| 2,294,117 | Hollingsworth | Aug. 25, 1942 |
| 2,301,649 | Thompson | Nov. 10, 1942 |
| 2,329,570 | Wellenstein et al. | Sept. 14, 1943 |